(12) United States Patent
Hayashida et al.

(10) Patent No.: US 8,158,911 B2
(45) Date of Patent: Apr. 17, 2012

(54) HEATING APPARATUS, SUBSTRATE PROCESSING APPARATUS EMPLOYING THE SAME, METHOD OF MANUFACTURING SEMICONDUCTOR DEVICES, AND EXTENDING MEMBER

(75) Inventors: Akira Hayashida, Toyama (JP); Masaaki Ueno, Toyama (JP); Masakazu Shimada, Toyama (JP); Kimio Kitamura, Osaka (JP); Kenji Tanaka, Osaka (JP); Jyunichi Nishihara, Osaka (JP)

(73) Assignees: Hitachi Kokusai Electric Inc., Tokyo (JP); Teitokusha Co., Ltd., Osaka (JP)

( * ) Notice: Subject to any disclaimer, the term of this patent is extended or adjusted under 35 U.S.C. 154(b) by 957 days.

(21) Appl. No.: 12/213,825

(22) Filed: Jun. 25, 2008

(65) Prior Publication Data

US 2009/0014428 A1    Jan. 15, 2009

(30) Foreign Application Priority Data

Jun. 25, 2007  (JP) ................................ 2007-167003
Jun. 12, 2008  (JP) ................................ 2008-154377

(51) Int. Cl.
*F27B 5/14*    (2006.01)
*F26B 19/00*    (2006.01)
(52) U.S. Cl. ........ 219/390; 219/200; 219/405; 219/411; 392/416; 392/418; 118/724; 118/725; 118/50.1
(58) Field of Classification Search .................. 219/200, 219/390, 405, 411; 392/416, 418; 118/724, 118/725, 50.1
See application file for complete search history.

(56) References Cited

FOREIGN PATENT DOCUMENTS

| JP | 2004-311648 | * | 11/2004 |
| JP | 2004-311648 | A | 11/2004 |
| WO | WO-2007/023855 | A1 | 3/2007 |

* cited by examiner

*Primary Examiner* — Shawntina Fuqua
(74) *Attorney, Agent, or Firm* — Rader, Fishman & Grauer PLLC

(57) ABSTRACT

A heating apparatus comprises heating elements arranged of a sheet form and having notches or through holes provided therein, a side wall member made of an electrically conductive material and arranged to surround and define the heating space, and holding members disposed at the heating space side of the side wall member for holding at one end the heating elements. Also, extending members are provided, each member comprising an extending-through portion arranged to project from the heating space side of the side wall member and extend through the notch or through hole between both ends in the heating element and projected portions arranged to project at both, front and back, sides of the heating element from the extending-through portion in a direction, which is orthogonal to the extending direction of the extending-through portion, thus to inhibit the displacement of the heating elements along the extending direction.

19 Claims, 14 Drawing Sheets

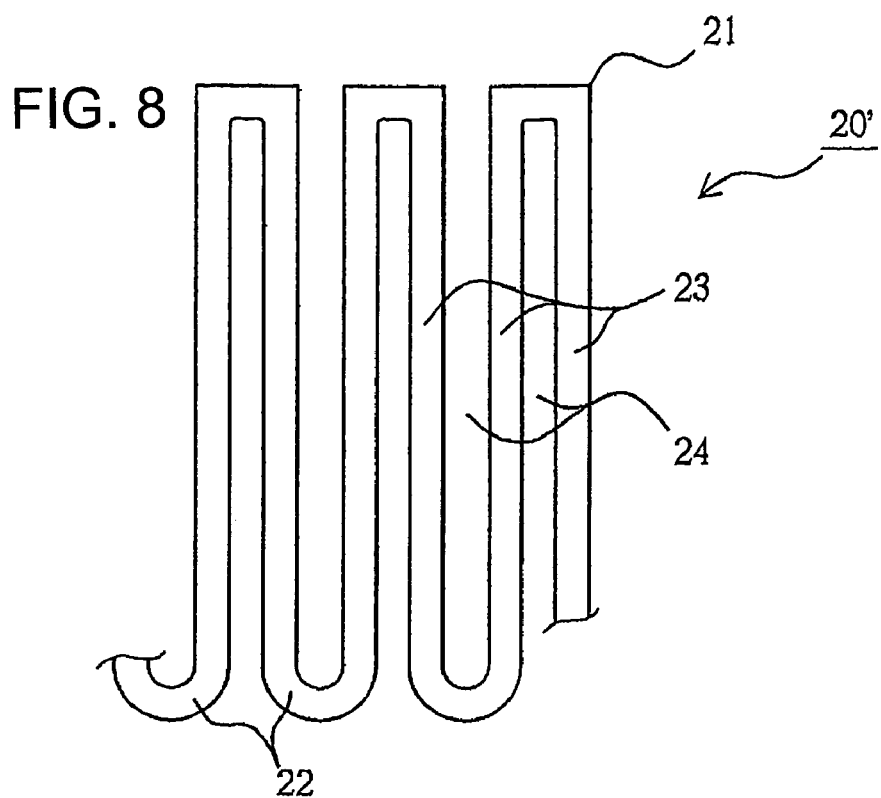
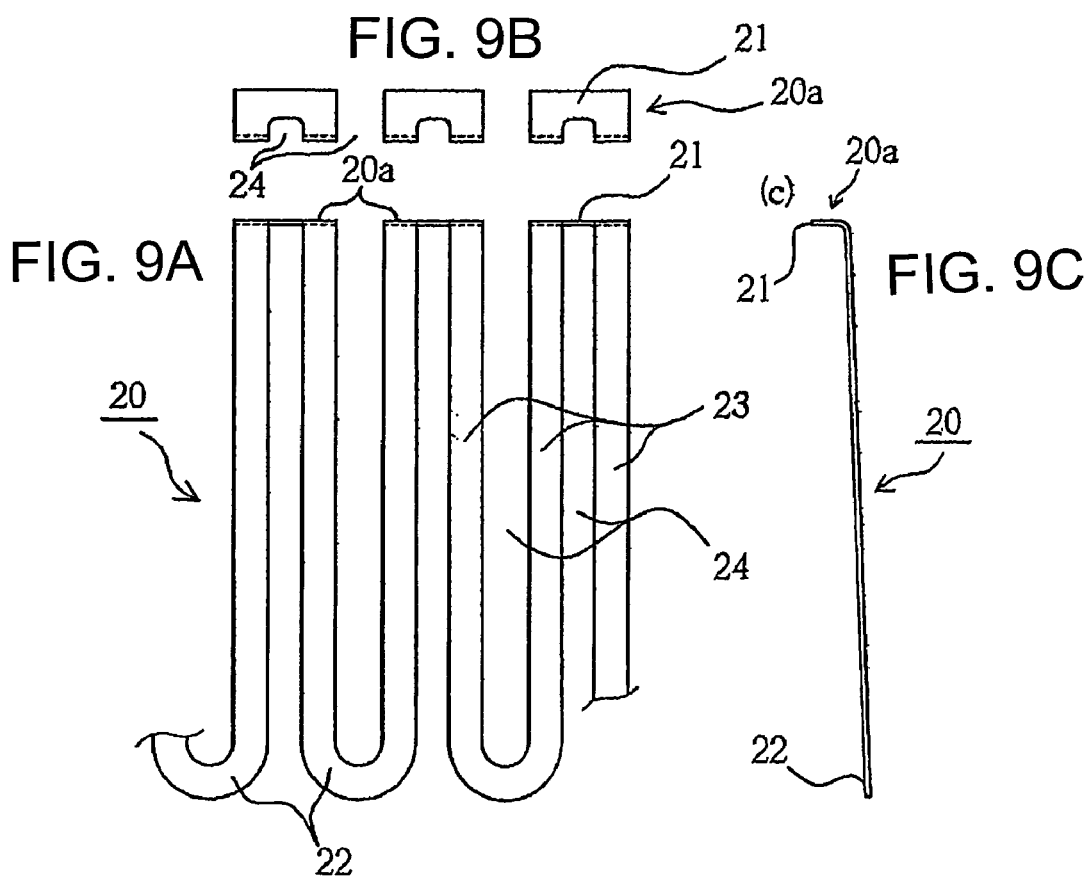

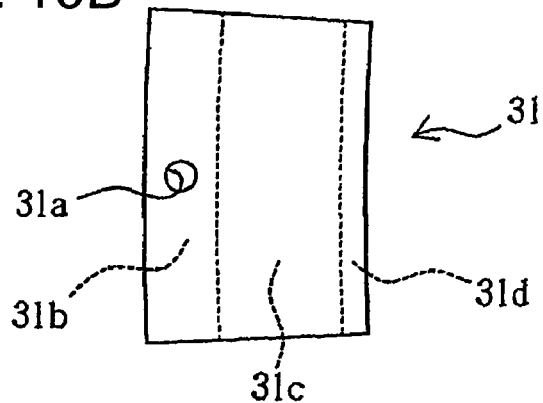
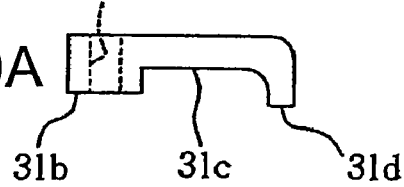
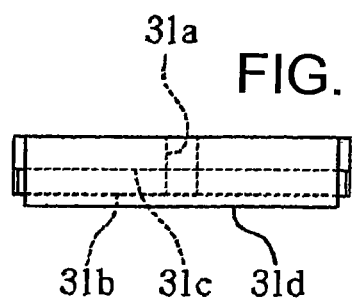
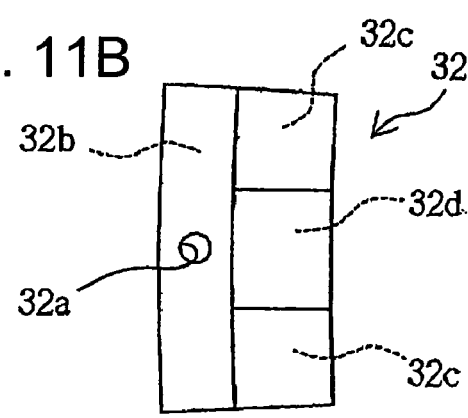
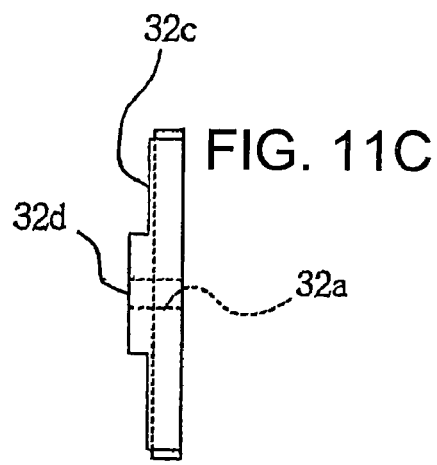
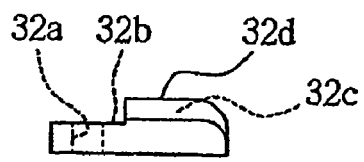

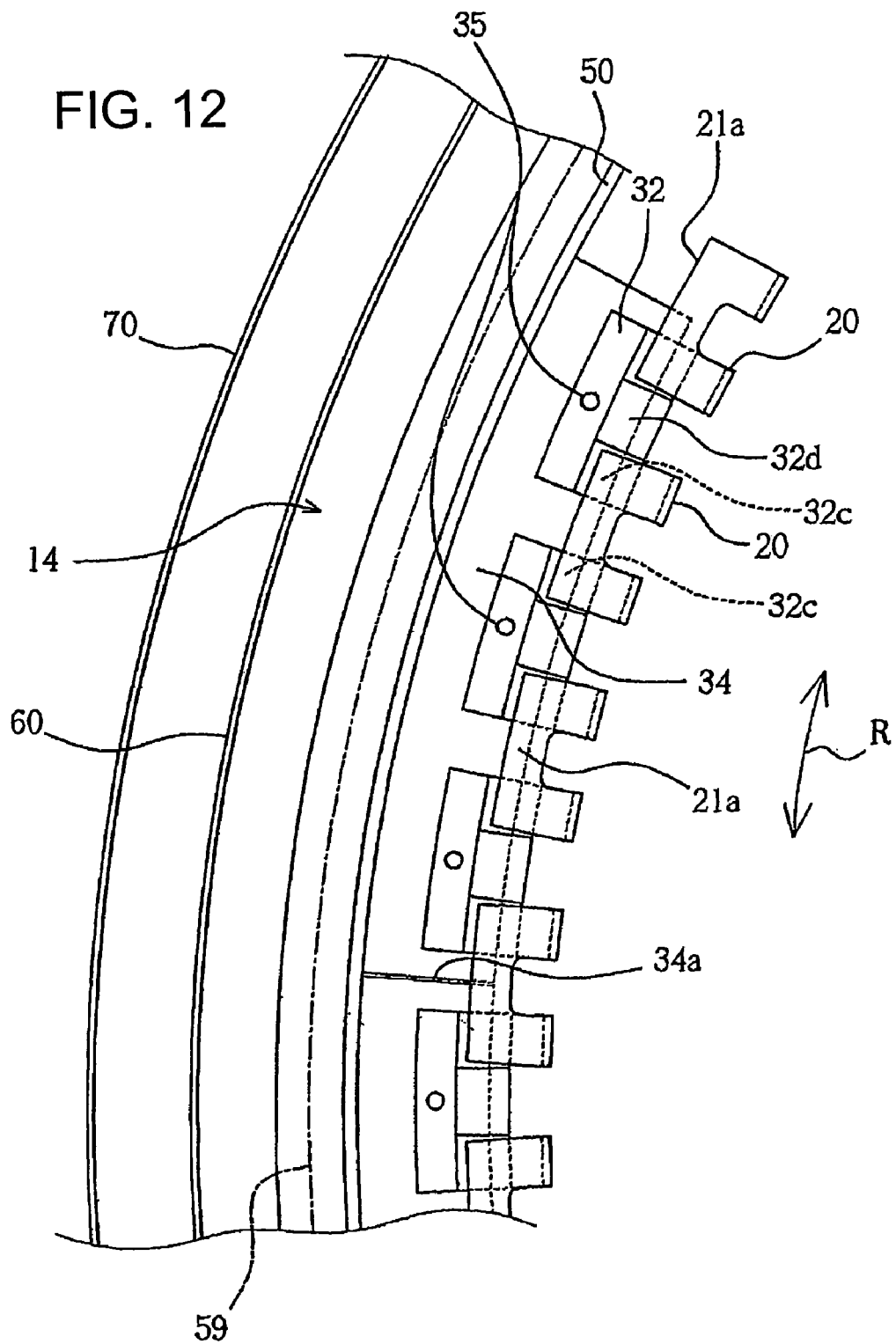

HEATING APPARATUS, SUBSTRATE PROCESSING APPARATUS EMPLOYING THE SAME, METHOD OF MANUFACTURING SEMICONDUCTOR DEVICES, AND EXTENDING MEMBER

BACKGROUND OF THE INVENTION

1. Field of the Invention

The present invention relates to a semiconductor device manufacturing technology or more particularly a heat processing technology for processing a substrate to be processed while being heated up by heating elements in a processing chamber and also relates to a heating apparatus, a substrate processing apparatus employing the heating apparatus, a method of manufacturing semiconductor devices, and extending members.

2. Description of the Related Art

FIG. 1 is a schematic cross sectional view of a processing furnace 500 equipped with a conventional heating apparatus. The conventional heating apparatus comprises a metallic casing 501 arranged of substantially a tubular shape with the upper end closed, a thermal insulator material 502 arranged of substantially a tubular shape and disposed at the inside of the casing 501, and heating wires 503 mounted to the inner wall of the thermal insulator material 502. The heating apparatus contains a thermal equalizer tube 504 and a reactor tube 505 which acts as a processing chamber and the action of heating up a wafer 506 in a given manner is carried out in the reactor tube 505.

It has been demanded in the metallic wiring process (Cu annealing etc.) to decrease the processing temperature (to not higher than 300° C.) and improve the throughput. Therefore, the shortening of the temperature increase and decrease of the wafer is essential. However, for responding to the above demand, such a conventional heating apparatus as shown in FIG. 1 employs a large amount of thermally insulating materials for permitting the use of heaters in middle and high temperature ranges, hence being low in the temperature increase and decrease response and hardly improving the throughput. It is thus desired to provide an improved heating apparatus which is high in the thermal response.

Disclosed in Patent Citation 1 is a substrate processing apparatus which allows its heating space to be cooled down rapidly with the cooling gas supplied through the pins which are provided to extend through the heating elements. The thermal response in the heating apparatus can thus be improved by modifying the cooling property.

Another substrate processing apparatus disclosed in Patent Citation 2 comprises heating elements disposed in a heater unit to surround the processing chamber, a first reflector disposed to surround the heating elements, and a second reflector disposed to surround the first reflector as spaced at the outer side by a distance from the first reflector.

However, as each of the conventional technologies fails to significantly improve the throughput, the introduction of a novel holding structure for the heating elements is much desired.

Patent Citation 1: WO2007/023855.
Patent Citation 2: Japanese Patent Laid-open Publication No. 2004-311648.

SUMMARY OF THE INVENTION

It is hence an object of the present invention, in view of the conventional aspect, to provide a novel holding structure for heating elements.

For achievement of the above object of the present invention, a heating apparatus is provided comprising: heating elements arranged of a sheet form and having notches or through holes provided therein; a side wall member made of an electrically conductive material and arranged to surround and define the heating space; holding members disposed at the heating space side of the side wall member for holding at one end the heating elements; and extending members, each member comprising an extending-through portion arranged to project from the heating space side of the side wall member and extend through the notch or through hole between both ends in the heating element and projected portions arranged to project at both, front and back, sides of the heating element from the extending-through portion in a direction, which is orthogonal to the extending direction of the extending-through portion, thus to inhibit the displacement of the heating elements along the extending direction.

According to the features of the substrate processing apparatus according to the present invention, the side wall is made of an electrically conductive material and remains low in the heat capacity, thus increasing the throughput. Also, the heating element can be inhibited by the projected portions of each extending member from being displaced along the extending direction particularly at its intermediate region, hence allowing the heating element particularly at its intermediate region to stay away from the side wall.

Other objects, arrangements, and effects of the present invention will be apparent from the detailed description of the preferred embodiments described below.

BRIEF DESCRIPTION OF THE DRAWINGS

FIG. 8 is a front view of a heating element after the blanking step and before the bending step;

FIGS. 9A and 9B are a front view and a plan view respectively of the heating element after the bending step;

FIG. 9C is a side elevation view of the heating element after the bending step;

FIGS. 10A, 10B, and 10C are a side view, a plan view, and a front view respectively of an upper insulator of a hanging insulator;

FIGS. 11A, 11B, and 11C are a side view, a plan view, and a front view respectively of a lower insulator of the hanging insulator;

FIG. 12 is a view, similar to FIG. 5, where upper fittings have been removed;

DESCRIPTION OF THE PREFERRED EMBODIMENTS

Figure 1:
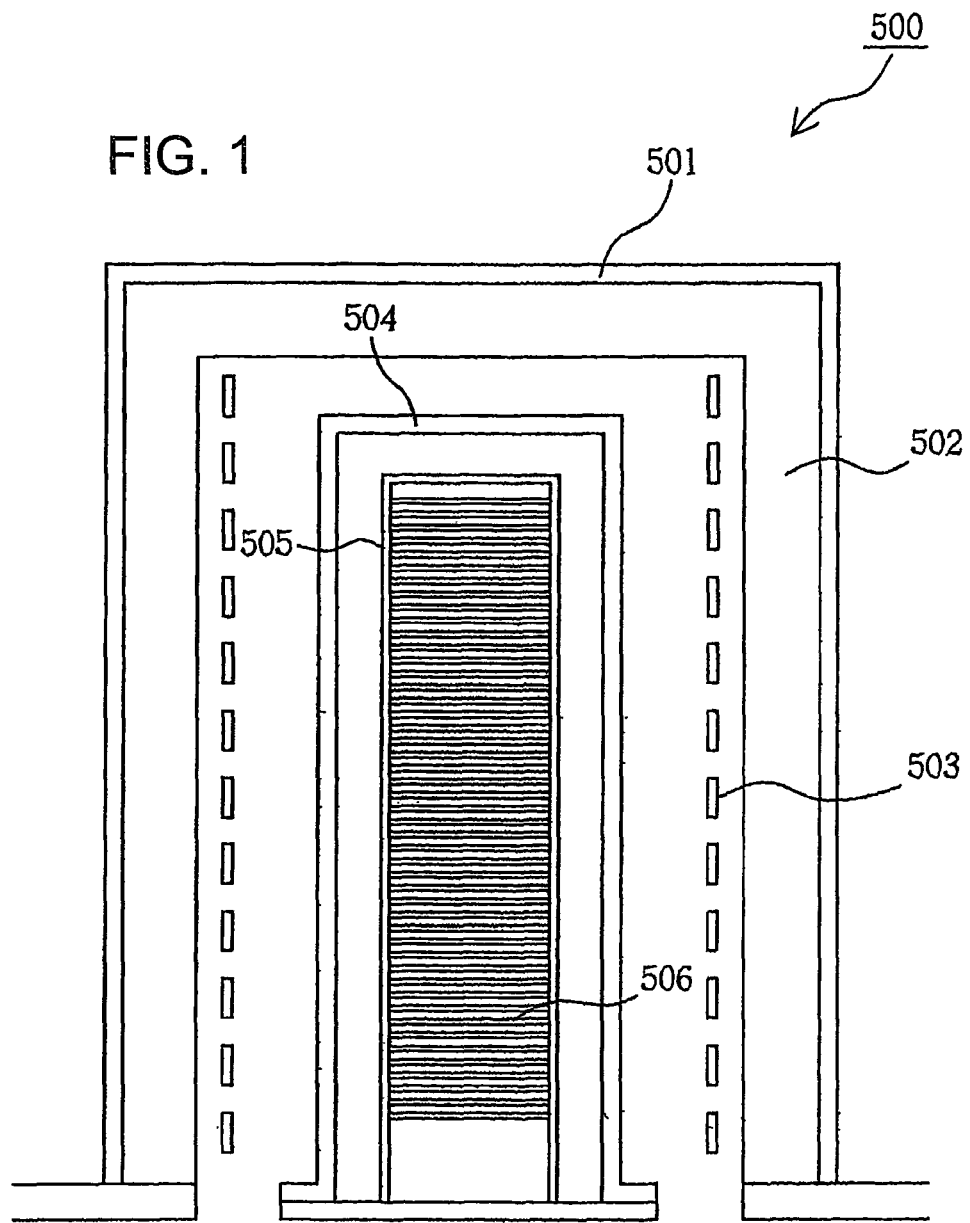
FIG. 1 is a schematic cross sectional view of a processing furnace using a convention heating apparatus.

The present invention will be described in more detail referring to the accompanying drawings.

One of the best modes for embodying the present invention will be described in the form of a first embodiment in conjunction with the drawings.

As shown in FIGS. 2 to 7, a substrate processing apparatus 1 comprises substantially a reactor container 309 acting as a processing chamber 308, a heating module 3 disposed at the outer periphery of the reactor container, and a main controller module 4.

The heating module 3 comprises substantially a ceiling 10, an intermediate unit 11 of a tubular shape, a lower case 12, a terminal case 13, and heating elements 20 disposed in the intermediate unit 11. The ceiling 10 has a discharge passage 81 of an elbow shape provided therein to open at the lower side and one side. A reflector 90 is disposed beneath the ceiling 10. The intermediate unit 11 has an inner shell 50 thereof supported throughout the circumference by an outer shell 60 for accommodating the heating elements 20 therein and is protected at the outer side with a decorative panel 70. The inner shell 50 and the outer shell 60 are made of an electrically conductive material such as stainless steel or any other metallic material.

A cooling gas infeed duct 7y is provided between the upper side of the intermediate unit 11 and a gas intake attachment 7x. An open/close valve 7a or more particularly a butterfly valve is mounted at the open end of the gas intake attachment 7x for opening and closing the flow passage. The gas intake attachment 7x is connected with a cooling gas supply conduit 7. A gas passage 14 is provided in a tubular shape between the inner shell 50 and the outer shell 60 for conveying the cooling medium. The cooling gas infeed duct 7y is communicated to the gas passage 14 by a group of conduits 61 disposed at substantially equal intervals in an annular arrangement. Also, the discharge passage 81 is communicated to a forced discharge conduit 8 equipped with a discharge blower 8a for forcibly discharging the gas from the internal or heating space provided in the heating apparatus 3. This allows the air or inert gas supplied from the cooling gas infeed conduit 7 to be conveyed as the cooling gas through the gas passage 14 and a set of insulator apertures, which will be explained later, to the heating space 18 before discharged from the forced discharge conduit 8.

The reactor container 309 comprises a thermal equalizer tube 315 and a reactor tube 310 arranged concentrically in the heating space 18 while the processing chamber 308 is formed in the reactor tube 310. A boat 300 on which the wafers 305 are horizontally placed in a stack is accommodated in the processing chamber 308. The boat 300 can be loaded into and out from the processing chamber 308 using a boat elevator which is not shown.

Also, the reactor tube 310 is communicated with a reactive gas infeed conduit 5x and a reacting gas discharge conduit 6x. The reactive gas infeed conduit 5x is equipped with a flow controller 5a while the reacting gas discharge (exhaust gas) conduit 6x is equipped with a pressure controller 6a. When a desired amount of the reactive gas has been introduced with the reactor tube 310 remaining at a predetermined pressure, the existing gas is discharged from a discharge outlet 6y to the discharge conduit 6x before finally released to the outside of the processing chamber.

Another cooling gas supply conduit 5y is communicated with an thermal equalizer internal space 317 defined between the thermal equalizer 315 and the reactor tube 310. The cooling gas supply conduit 5y is equipped with a flow controller 5b. The open/close valve 7a is mounted to the gas intake attachment 7x. The forced discharge conduit 8 is equipped with the discharge blower 8a which acts as a discharging device. In brief, the cooling gas can controllably be supplied into both the thermal equalizer tube internal space 317 and the heating space 18.

The heating elements 20 are divided into a desired number of zones Z1 to Z5 arranged axially of the tubular shape of the intermediate unit 11 and can thus be controlled at each zone. Each zone is accompanied with a temperature detector for detecting the temperature at the zone. Alternatively, the zones of the heating elements 20 may be shaped in the same pattern for producing the heat equally throughout the zones.

The action at each section of the substrate processing apparatus 1 is controlled by the main controller module 4. For example, the condition of the processing the wafers 305 in the reactor tube 310 is monitored and controlled by the main controller module 4. The main controller module 4 comprises a temperature monitor 4a, a heating controller (heater controller) 4b, a reflection controller 4c, a first flow controller 4d, a pressure controller 4e for controlling the pressure in the reactor tube 310, a second flow controller 4f, a discharge controller 4g, and a drive controller 4h for controlling the mechanical movements including the boat elevator.

The temperature monitor 4a is designed for detecting the temperature of three, first to third, temperature detectors TC1 to TC3. The first temperature detector TC1 is mounted to each of the zones Z1 to Z5 as located close to the heating elements 20. The second temperature detector TC2 is mounted to each of the zones Z1 to Z5 as surrounding the reactor tube 310. The third temperature detector TC3 is mounted above the reactor tube 310 or at a particular location such as the upper center of the reactor tube 310.

The heating controller 4b is arranged responsive to the measurement of the temperature monitor 4a for controlling the heat generated by the heating elements 20 at each of the zones Z1 to Z5. The reflection controller 4c is arranged responsive to the measurement of the temperature monitor 4a for controlling the action of an actuator 99 for driving the reflector 90. More specifically, the reflection controller 4c controls the tilting of the reflecting member 91 mirror finished with its lower side thus to modify the concentration of reflected heat at the upper center of the reactor tube 310 for controlling the temperature.

The first flow controller 4d is designed for controlling the action of the flow controller 5a while the pressure controller 4e is designed for controlling the action of the pressure controller 6a thus to determine the supply and pressure of the reactive gas. The second flow controller 4f is designed for controlling the action of the flow controller 5b while the discharge controller 4g is designed for controlling the action of the open/close valve 7a and the discharge blower 8a thus to determine the supply and discharge of the cooling gas.

Figure 2:
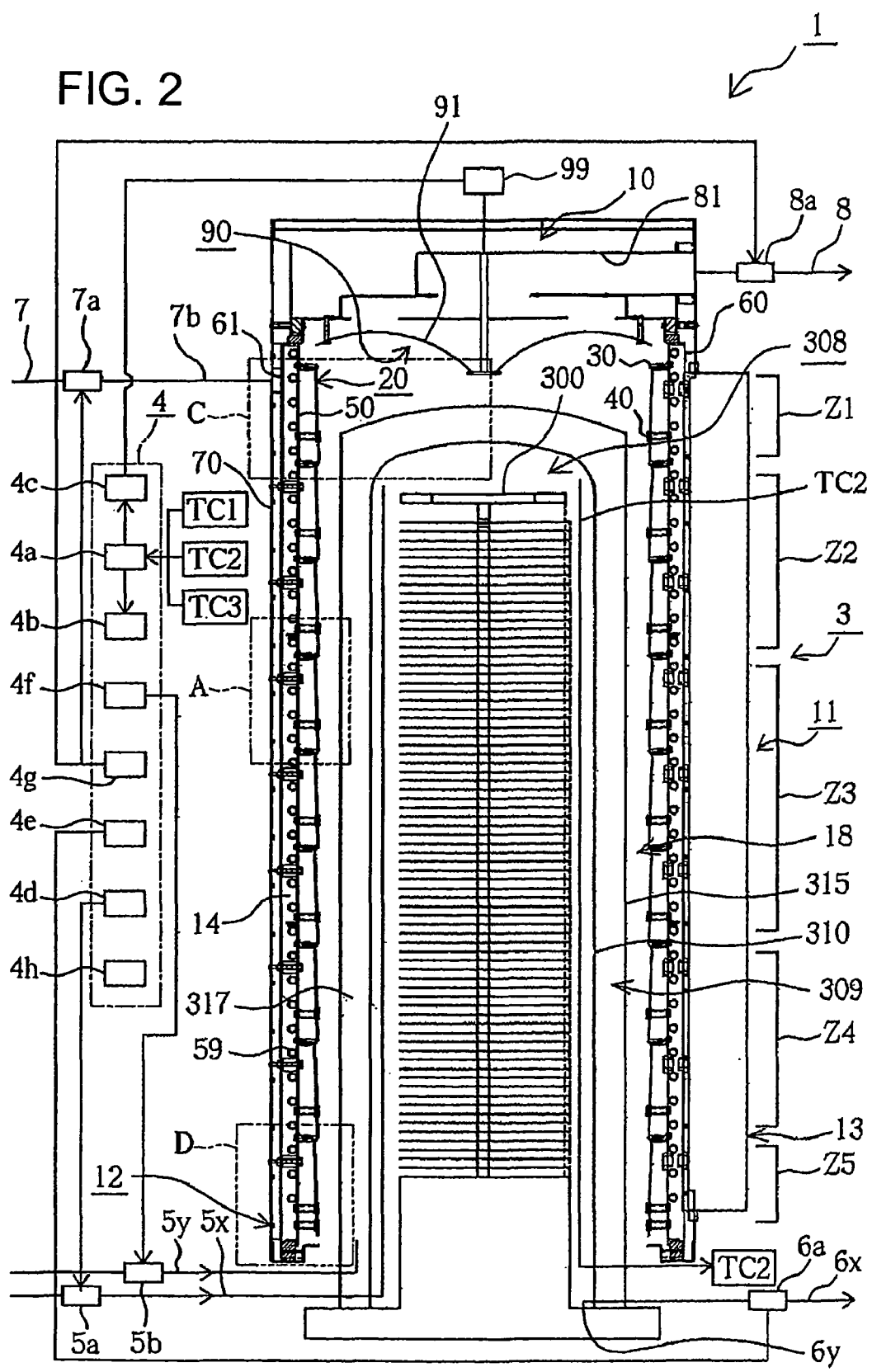
FIG. 2 is a longitudinally cross sectional view schematically showing a substrate processing apparatus according to the present invention.
Figure 3:
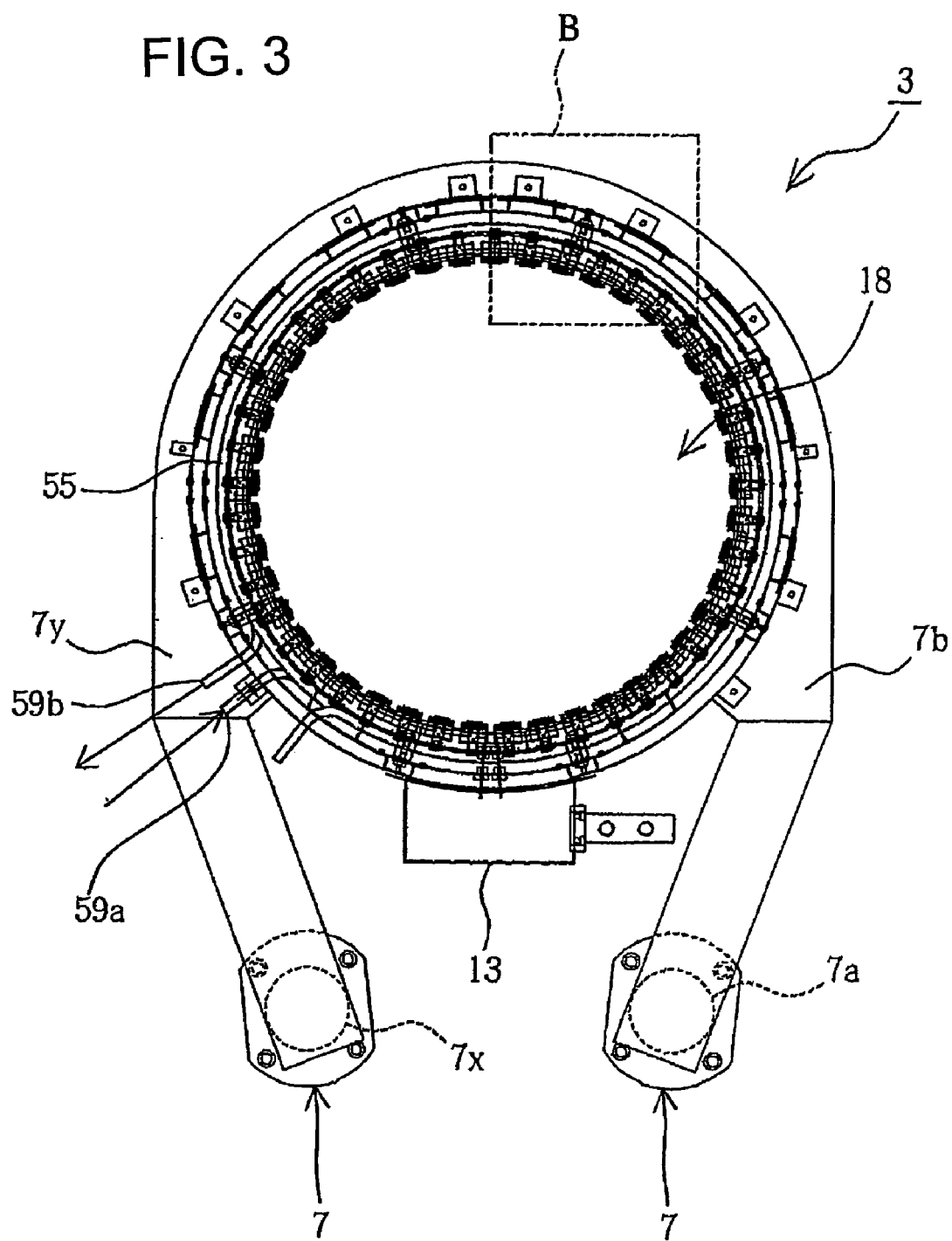
FIG. 3 is a transversely cross sectional view of the proximity of a ceiling.
Figure 4:
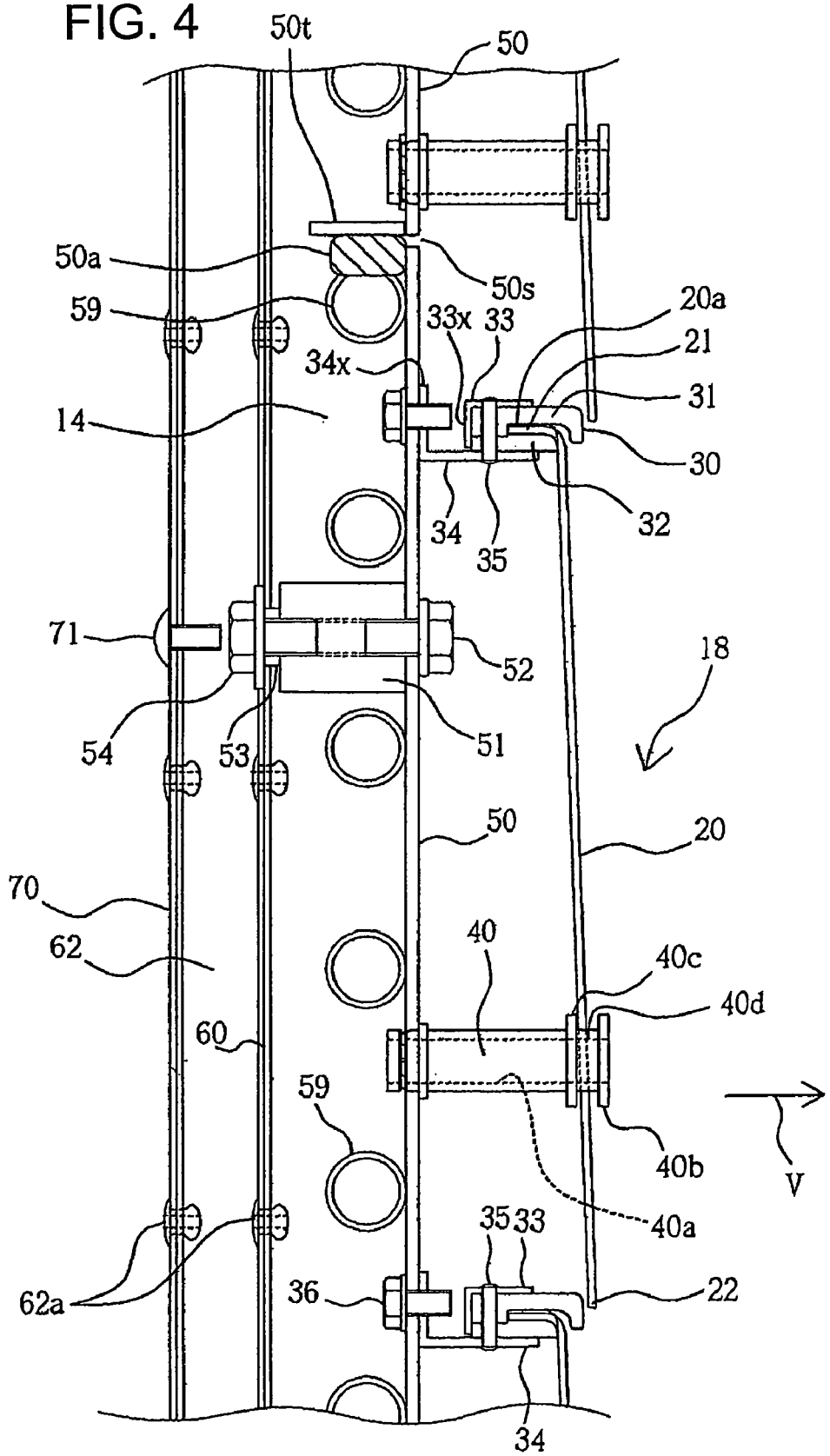
FIG. 4 is an enlarged view of the region A in FIG. 2.
Figure 5:
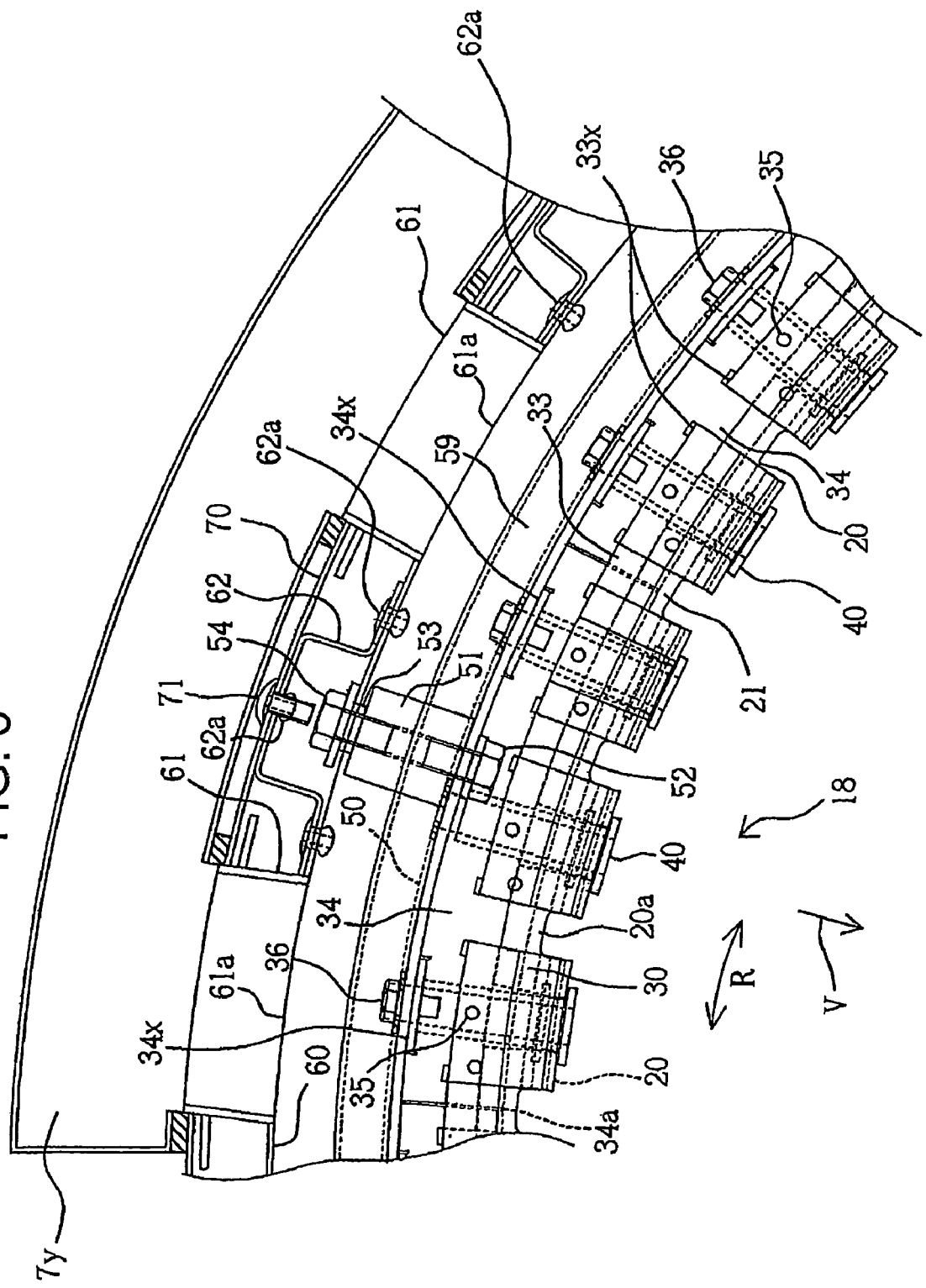
FIG. 5 is an enlarged view of the region B in FIG. 3.
Figure 6:
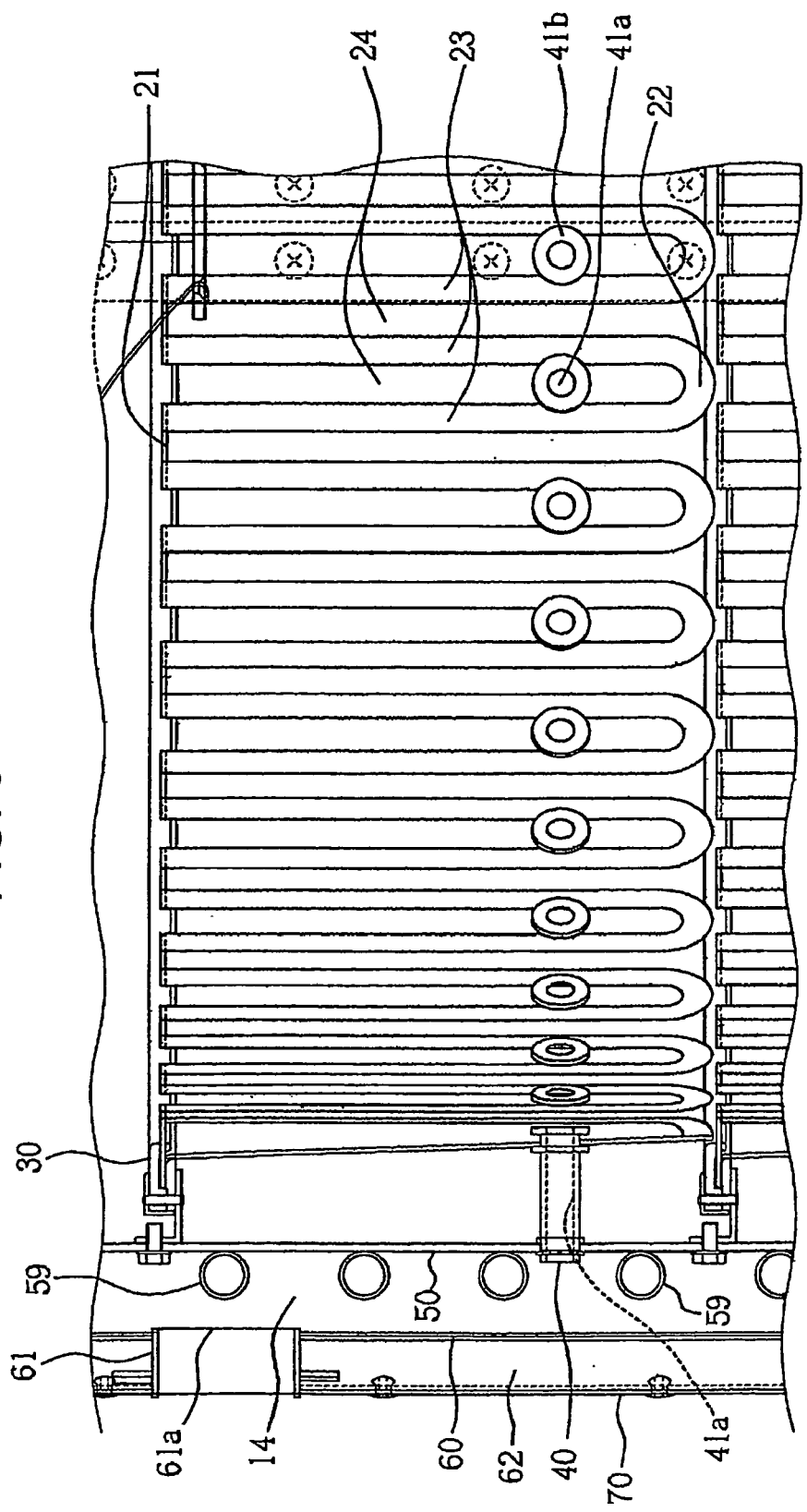
FIG. 6 is an enlarged view of the region C in FIG. 2.

FIG. 4 is an enlarged view showing the section A in FIG. 2. The heating elements (heater wires) 20 are fixedly mounted to the inner shell 50 by hanging insulators 30 made of an electrically insulating material such as alumina. The heating elements 20 are fabricated as flat heating members from a heating material, such as Fe—Al—Cr alloy, which can heat up quickly and formed in a strip shape in the cross section for increasing the heating area. More particularly, the heating element 20 is arranged in a zigzag shape extending up and down with its turned portions 21, 22 provided at both sides. The two, upper and lower, turned portions 21, 22 are displaced from each other by a half pitch as sandwiching element portions 23 and gap portions 24 arranged alternately. The upper turned portions 21 of the heating element 20 are bent inwardly to have bent portions 20a which are then held by their respective hanging insulators 30. The inner side of the inner shell 50 is mirror finished for reflecting and directing the heat emitted from the back side of the element portions 23 of the heating element 20 through the gap portions 24 towards the heating space 18.

The hanging insulator 30 comprises an upper insulator 31 and a lower insulator 32 which both are made of a heat-resistant insulating material such as alumina, sandwiched between an upper fitting 33 and a lower fitting and joined together by a pin 35 in welding manner to the corresponding bent portion 20a of the heating element 20 while holding the same from both, upper and lower, sides. The other end of the lower fitting 34 is bent and joined at two locations by bolts 36 to the inner shell 50.

A number of fast cooling pipes 40 are mounted to the inner shell 50 for feeding the cooling gas through its communicating bore 40a from the gas passage 14 to the inside of the inner shell 50 as projecting inwardly from the inner side of the inner shell 50. The fast cooling pipes 40 are made of a heat-resistant, electrically insulating material such as alumina. The fast cooling pipe 40 is designed for inhibiting the movement at the intermediate of the heating element 20 with its extending-through portion 40d extending through the gap portion 24 of the heating element 20 and its flange portions 40b, 40c of substantially a circular shape which are elongated outwardly at a right angle to the extending direction V along which the fast cooling pipe 40 extends through the heating element 20. More specifically, the extending-through portion 40d of the fast cooling pipe 40 serves as a groove between the two flange portions 40b, 40c. In addition, the heating element 20 is overlapped at the lower end with the upper end of the hanging insulator 30 at the lower level so that its movement along the extending direction of the fast cooling pipe 40 is inhibited.

A water cooling conduit 59 is mounted as a cooling medium running passage on the back side of the inner shell 50. The water cooling conduit 59 is arranged in a spiral form directly on the back or outer side of the inner shell 50, extending axially. As the inner shell 50 is prevented from increasing its temperature by the cooling medium such as cooling water running through water supply and discharge passages 59a, 59b, its temperature can remain substantially at a constant degree.

The outer shell 60 is insulatingly mounted by a set of connecting insulators 51 to the outer side of the inner shell 50. The connecting insulators 51 are made of an alumina material which has both properties of the electrical insulation and the resistance to heat and permit the outer shell 60 to receive no current even if the inner shell 50 accidentally comes into direct contact with the heating elements 20 and becomes short-circuited.

The connecting insulators 51 are fixedly joined at the inner end by first bolts 52 to the inner shell 50. The connecting insulators 51 are fixedly joined at the outer end to the outer shell 60 by second bolts 53 via annular hollow collars 53 made of a heat-resistant insulating material. As each of the collars 53 is set to extend through the mounting hole in the outer shell 60 with its thickness greater than that of the outer shell 60, it produces a clearance (gap) between the head at the lower side of the second bolt 54 and the outer surface of the connecting insulator 51. Accordingly, when the inner shell 50 is expanded by thermal expansion, its expansion can be offset by the clearance thus protecting the outer shell 60 from receiving any thermal stress and generating any deformation.

The decorative panel 70 is mounted as an outermost shell or side wall by pillars 62 to the outer side of the outer shell 60. The pillars 62 are joined at their flanges by, for example, metallic rivets 62a to both the outer shell 60 and the decorative panel 70 while the outer shell 60 has tubular openings 61a provided at the upper end thereof for communication with the gas passage 14. As pipes 61 are mounted to communicate at one end to the openings 61a, they extends through the decorative panel 70 and their other ends are communicated with the cooling gas infeed duct 7y. The pillars 62 and the decorative panel 70 are fabricated from an electrically conductive materials, for example, a metallic material such as stainless steel. The decorative panel 70 and the outer shell 60 are electrically connected to each other by the pillars 62. The substrate processing apparatus itself is protected by the previously described insulating arrangement from short-circuiting to the outer shell 60 and the decorative panel 70 thus to allow no electrical shock during the maintenance action or no breakage of electrical components.

Referring to FIG. 4, the inner shell 50 are separated into segments along the vertical direction. Any two, upper and lower, adjacent segments of the inner shell 50 are separated from each other by a gap 50s. A thermally insulating blanket 50a made of a thermally insulating material such as ceramic fiber is disposed between a first flange 50t provided at the lower end of the upper segment and the water cooling conduit 59 mounted to the lower segment of the inner shell 50, thus inhibiting the escape of heat from the gap 50s and thermally separating the two, upper and lower, segments from each other.

Figure 7:
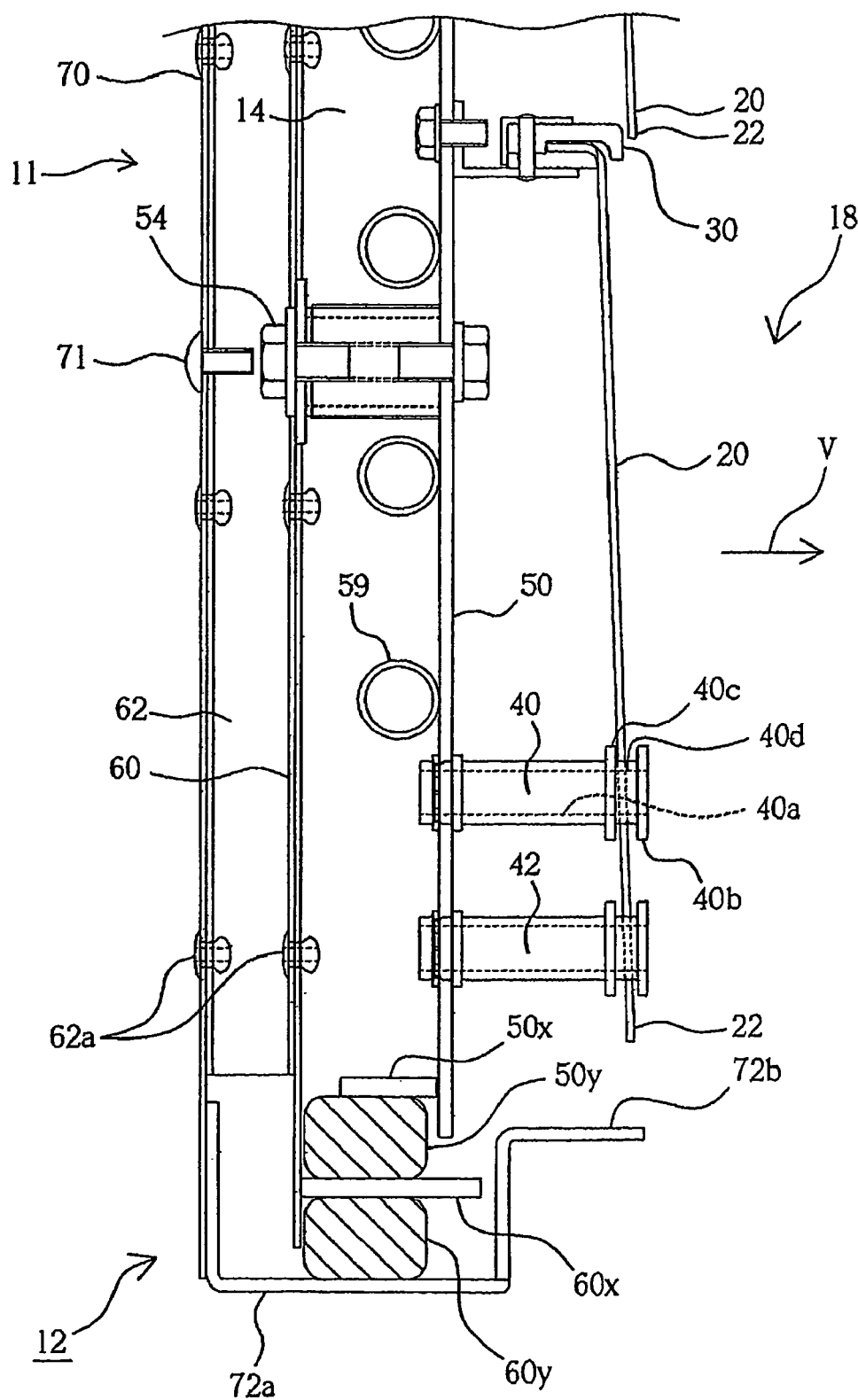
FIG. 7 is an enlarged view of the region D in FIG. 2.

Referring to FIG. 7, a thermally insulating blanket 50y made of an electrically, thermally insulating material is disposed between a second flange 50x provided outwardly at the lower end of the lowermost segment of the inner shell 50 and a third flange 60x provided inwardly at the lower end of the outer shell 60 at the lowermost end of the intermediate unit 11. This allows the inner shell 50 and the outer shell 60 to be electrically insulated from each other and remain air-tightened by the thermally insulating blanket 50y between them. In addition, a thermally insulating blanket 60y made of a thermally insulating material is disposed between the third flange 60x and a bottom cover 72a for ensuring the air tightness of the internal space in the inner shell 50. The same arrangement is provided between the intermediate unit 11 and the ceiling 10 for ensuring both the electrical insulation and the air tightness. The lowermost heating element 20 at the bottom level is supported by an extra water cooling conduit 42 which is different from the water cooling conduits 40 mounted to the heating element 20 for inhibiting the displacement at the intermediate of the heating element 20.

The heating element 20 and its holding or supporting structure will be explained referring to FIGS. 4 to 6 and FIGS. 8 to 12.

FIG. 8 illustrates a form of the heating element 20' after the blanking step and before the bending step while FIG. 9 illustrates the heating element 20 after the bending step. The upper turned portions 21 at the zigzag form of the heating element 20 are squared and turned by the bending step to the bent portions 20a to be held. The heating element 20 may be inhibited from displacement with the action of projections 32d, which will be explained later, for eliminating any injury or short-circuit and increasing the operating life.

The lower turned portions 22 of the heating element 20 are arched and configured equal or greater in the width than the intermediate element portions 23 so as to minimize the mass of the intermediate element portions 23. Accordingly, the heating element 20 is decreased in the heat capacity and can thus be improved in the total response.

As shown in FIGS. 4 to 6 and FIGS. 10 to 12, the upper insulator 31 and the lower insulator 32 of the insulator 30 have pin accepting apertures 31a and 32a provided respectively therein. The upper insulator 31 is joined to the lower insulator 32 with its projection 31b at the lower side thereof fitting into a recess 32b provided in the upper side of the lower insulator 32. This allows a gap to be provided between the lower side 31c of the upper insulator 31 and the upper side 32c of the lower insulator 32 for accepting corresponding one of the bent portions 20a of the heating element 20. The upper insulator 31 has an inner end projection 31d provided on the innermost end thereof for holding and inhibiting the bent portion 20a from dropping off.

The projection 32d of the lower insulator 32 is configured to substantially a four-sided parallelepiped shape as disposed between two portions of the upper side 32c. Each bent portion 20a of the heating element 20 is seated to bridge any two adjacent portions of the upper side 32c of the lower insulators 32 which are arranged circumferentially at equal intervals. Accordingly, as the heating elements 20 are aligned along the circumferential direction R at the inner side of the inner shell 50, their bent portions 20a come into direct contact with the projections 32d and can thus be inhibited from displacement along the circumferential direction R. Since the hanging insulators 30 are arranged at equal intervals along the circumferential direction R, they can be decreased in the heat capacity thus to declines the total heat capacity and improve the thermal response.

The fast cooling pipes 40 are arranged to extend through the heating elements 20 along the extending direction V which is at a right angle to the inner wall of the inner shell 50. As sandwiched between the two flange portions 40b and 40c of each pipe 40, the heating element 20 can be inhibited from displacement at the intermediate. Also, with its lower end 22 overlapping the upper side of the hanging insulator 30 at the lower level, the heating element 20 can be inhibited from displacement along the extending direction V. More particularly, the fast cooling pipes 40 inhibits the displacement or deflection outwardly and inwardly at the intermediate of the heating elements 20 along the radial direction of the heating apparatus while the hanging insulators 40 inhibits the outward deflection at the lower end of the intermediate portions 23 of the heating elements 20. The inner shell 50 acting as a side wall is fabricated from the metallic material, such as stainless steel, which is low in the heat capacity and can hold at insulating relationship the heating elements 20 operable under the atmosphere. Most of the electrically conductive materials including metals are low in the heat capacity while most of the not electrically conductive materials including alumina and quarts are high in the heat capacity. Accordingly, the heating apparatus 3 can be improved in the thermal response.

It is desired in the respect of rigidity that the upper fittings 33 and the lower fittings 34 for holding the insulators 30 are arranged along the circumferential direction R. However, they may preferably be spaced from one another for protecting the heating elements 20 from being thermally deformed by the effect of thermal expansion. In this embodiment, a group of the hanging insulators 30 are supported by one combination of the upper fitting 33 and the lower fitting 34 thus to minimize the number of gaps 34a between the lower fittings 34 for offsetting the thermal expansion while the rigidity against twisting remains guaranteed. Also, the upper fitting 33 is bridged between any two adjacent lower fittings 34 for increasing the rigidity against twisting.

The structure of the lower case 12 will now be described referring to FIG. 7. The lower turned portions 22 of each heating element 20 are protected by the hanging insulator 30 at the lower level from coming close to the inner shell 50. However, the lowermost heating element 20 at the lowest level is supported with no hanging insulator. For compensation, the extra fast cooling pipe 42 is provided at the lower turned portions 22 of the lowermost heating element 20 at the lowest level, while the intermediate of the lowermost heating element 20 is supported directly by the fast cooling pipe 40 for inhibiting any deflection, for preventing the lowermost heating element 20 from coming close to the inner shell 50 and reflecting along the extending direction V. Although the fast cooling pipes 40, 42 are made of the same material, they may be fabricated from different materials.

On the other hand, with the extra fast cooling pipe 42 inhibiting the lower ends of the heating element 20 from being deflected as shown in FIG. 7, the intermediate of the heating element 20 will hardly be protected from being deflected outwardly or inwardly with no use of the fast cooling pipe 40. In case that the intermediate of the heating element 20 is deflected inwardly towards the heating space 18, it may come into direct contact with the reactor container. When the intermediate of the heating element 20 is deflected outwardly, its may come into direct contact with the inner shell 50 thus creating a short-circuit (i.e. the inner shell receives any unwanted current). On the other hand, with the fast cooling pipe 40 inhibiting the intermediate of the heating element 20 from being deflected, the heating element 20 will hardly be protected at the lower end from being deflected outwardly but come into direct contact with the inner shell 50. If the heating element 20 is deflected inwardly and outwardly at higher frequency, it will increase its physical injury due to the thermal stress and decline its operating life. The structure shown in FIG. 7 is intended to eliminate the above drawback. The structure shown in FIG. 7 which includes the two different types of the cooling pipes may be applied to the heating element at any level as well as the lowest level. It is however desirable for improving the concentration of the heating elements 20 along the supporting (vertical) direction to use the hanging insulator 30 at the lower level for protecting the lower turned portions 22 of each heating element from coming close to the inner shell 50. In view of the heat capacity, the use of the hanging insulator 30 at the lower level for protecting the lower turned portions 22 of each heating element from coming close to the inner shell 50 is also favorable for minimizing the number of the fast cooling pipes (insulating).

As shown in FIGS. 2 and 4, the heating elements 20 in this embodiment are stuck up in nine levels while the inner shell 50 is separated into three segments along the vertical direction, each segment carrying three levels of the heating elements 20. The gaps 50s are provided for offsetting the expansion of the inner shell 50 caused by thermal expansion. For inhibiting the cooling gas from running through the gap 50 into the heating space 18, the thermally insulating blanket 50u is used to shut the gap 50s. More particularly, the flange 50t is provided at the lower end of each segment of the inner shell 50 and the thermally insulating blanket 50u is sandwiched between the flange 50t and the water cooling conduit 59 mounted to the upper end of the segment at the lower level of the inner shell 50 for closing the gap 50s. The structure thus allows the thermally insulating blanket 50u to offset the expansion or contraction of the inner shell 50 with its elastic property, thus ensuring the air tightness between the inner shell 50 and the heating space 18.

The fast cooling pipes 40 can quickly cool down the reactor container 309 and thus the wafers loaded in the same with the cooling gas introduced through their communicating bores 40a. However, since the gaps 50s are lower in the conductance than the fast cooling pipes 40, they cause most of the cooling gas to leak out to the heating space. Also, the gaps 50s are located in the inner shell 50 as distanced further from the reactor container 309 than the outlets of the fast cooling pipes 40. As the heating elements are disposed in the front of the reactor container 309, the action of cooling down the reactor container 309 will be declined in the efficiency. For compensation, the structural arrangement for closing the gaps 50s is needed. For the purpose, the flange 50t and the water cooling conduit 59 are provided at both sides of the gap 50s. The structural arrangement will be favorable when the flange is disposed at one side and the water cooling conduit is disposed at the other side.

It is not always true that the proper allocation of the water cooling conduits 59 close to the gaps 50c ensures the optimum cooling effect. Accordingly, each segment of the inner shell is arranged to carry a group of the heating elements 20 at two or more levels but not the inner shell separated into nine segments corresponding to the nine levels of the heating elements 20 respectively, whereby the generation of differences in the temperature between the wafers will be avoided. In this embodiment, each segment of the inner shell 50 is determined to carry three levels of the heating elements 20 for minimizing the drawback of the gaps with the expansion due to thermal expansion remaining relatively small. Although the water cooling conduits are grouped to three systems to correspond to the three segments of the inner shell respectively in this embodiment, they may be connected with one system or grouped to a desired number of systems.

The action of the substrate processing apparatus 1 will then be described.

The action of processing the wafers 305 starts with loading the boat 300 which carries the wafers 305 into the reactor tube 310 by the movement of the boat elevator and rapidly heating up the same to a desired temperature by the heating action of the heating apparatus 3. When the wafers 305 haven been heated up to the desired temperature by the heating apparatus 3, the reactive gas is introduced from the reactive gas infeed conduit 5x. The action of thermally processing the wafers 305 is performed when the reactive gas has been removed out the reacting gas discharge conduit 6x.

In common, the furnace is kept at a preset temperature, e.g., 550° C., before the boat 300 is loaded in. When the boat 300 has been loaded in, the furnace is heated up to a desired, wafer processing temperature, e.g., 850° C. Both the temperature prior to the loading and the temperature for processing the wafers can selectively be determined depending on the requirements of the processing action in the substrate processing apparatus.

The heating elements 20 at each level are measured at each zone by the temperature monitor 4a and the temperature of the heating action can thus be controlled with the heating elements 20 and the reflector 90. The heating element 20 at each zone is a single element. This allows each of the heating elements 20 to be easily identified when its defect such as disconnection is found. The deterioration of the heating elements at each level can also be detected with ease.

After the completion of the processing action, the furnace is rapidly cooled down to a wafer unloading temperature, e.g., 550° C. The cooling of the wafers 305 after the processing action involves opening the flow controller 5a and the air valve 7a to introduce air or inactive gas such as nitrogen gas from the cooling gas supply conduits 5y and 7. The cooling gas received from the cooling gas supply conduit is introduced from the extending bores 40a of the fast cooling pipes 40 into the heating space 18 where it quickly cool down the heating elements 20 from both, inner and outer, sides.

Using the construction of the cooling pipes 40, the speed for cooling the heater and thus the wafers can be improved thus to enhance the throughput of the wafer processing action. Also, since the cooling pipes 40 serve as the retainers for retaining the heating elements and the cooling gas guiding passages, no separate conduits for feeding the heater cooling gas will be needed while the heating area on the inner wall of the furnace is increased. Moreover, the openings of the extending bores 40a of the cooling pipes 40 are located more inward than the heating elements 20, hence protecting the heating elements 20 from being cooled down locally by the cooling gas. Accordingly, the heating elements 20 is prevented from local deflection, twisting, and fracture and can thus suffer from no disconnection or no direct contact with the reactor tube 310.

The cooling gas to be introduced into the tubular gas passage 14 is dispersed from the cooling gas infeed duct 7y which is large in the volumetric size and can thus enter the gas passage 14 uniformly while its biasing flow is controlled. When having been conveyed through the conduits 61, the gas passage 14, and the fast cooling pipes 40 into the heating space 18, the cooling gas runs upwardly from the heating space 18 and is finally discharged from the discharge conduit 81. The inner side of the inner shell 50 is cooled down by the cooling gas running upwardly through the heating space 18 while the thermal equalizer tube 315 and the reactor tube 310 are cooled down by the cooling gas running upwardly through the heating space 18 and the thermal equalizer internal space 317. As the result, the wafers 305 in the reactor tube 310 can quickly be cooled down. The heating elements 20 made of Fe—Cr—Al, carbon, or SiC enables rapid heating up to a higher temperature while the rapid cooling down of the heating apparatus 3 by the cooling gas is carried out.

When the cooling action has been completed, the boat elevator lifts down the boat 300 and the processed wafers 305 are unloaded from the boat 300. In case that the de-pressurizing action is involved, the boat 300 is lifted down after the pressure in the reactor chamber returns back to an atmosphere level.

The present invention described in this specification is also implemented in the form of the following embodiments.

1) A heating apparatus for use in a substrate processing apparatus for processing a substrate is provided comprising: heating elements arranged of a sheet form and having notches or through holes provided therein; a side wall member made of an electrically conductive material and arranged to surround and define the heating space; holders (holding members) disposed at the heating space side of the side wall member for holding the heating elements; and extending members arranged to project from the heating space side of the side wall member and extend through the notches or through holes, wherein the holders are arranged to hold at one end the heating elements and each of the extending members comprises an extending-through portion (extending-through portion) arranged to extend through the notch or through hole at an intermediate portion (region) between one end and the other end of the corresponding heating element and projected portions arranged to project at both, front and back, sides of the heating element from the extending-through portion in a direction, which is orthogonal to the extending direction of the extending-through portion, thus to inhibit the displacement of the heating elements along the extending direction.

2) A substrate processing apparatus, heating apparatus, and holding structure for heating elements, comprising: heating elements having a zigzag turned construction; an electrically conductive inner wall; first insulators mounted perpendicularly to the inner wall; and second insulators mounted perpendicularly to the inner wall, wherein the turned portions (regions) at the upper end of each of the heating elements are joined to the first insulators while the turned portions at the lower end of the heating elements are engaged as inserted with the second insulators so that the displacement of the heating element is inhibited by two flanges provided perpendicularly on the second insulators.

3) A substrate processing apparatus, heating apparatus, and holding structure for heating module, comprising: a processing chamber in which a substrate is accommodated and processed; and a heating module for heating the substrate in the processing chamber, wherein the heating module comprises heating elements, a first tubular inner shell, and a second tubular inner shell, the first inner shell and the second inner shell both disposed at the outside of the heating elements and spaced from each other by a space gap, while a first flange is provided at the lower end of the first inner shell, a second flange is provided at the upper end of the second inner shell disposed beneath the first inner shell, and an elastic member is disposed between the first flange and the second flange. The second flange may preferably be implemented by a water cooling conduit for cooling down the inner shell.

4) A substrate processing apparatus, heating apparatus, and holding structure for heating elements, comprising: a processing chamber in which a substrate is accommodated and processed; and heating elements for heating the substrate in the processing chamber, wherein each of the heating elements is holded by a hanging insulator which supported as gripped at the upper end of heating elements and by two insulators which are inserted in the lower end of heating elements and has two flanges provided thereon for inhibiting any inward and outward deformation of the heating element.

5) A holding structure for substrate processing apparatus, heating apparatus, and heating apparatus elements, comprising: a processing chamber in which a substrate is accommodated and processed; and heating elements for heating the substrate in the processing chamber, wherein each of the heating elements is arranged of a zigzag form of which the upper end is supported by insulators while the turned portions at the upper end of the heating element are squared and secured with projections provided on the inner sides of the insulators so that their displacement along the circumferential direction is inhibited.

6) A substrate processing apparatus, heating apparatus, and holding structure for heating elements, comprising: a tubular side wall; and heating elements arranged of a sheet form having a number of gaps, wherein the side wall is arranged with its inner side finished for reflecting heat and the heating elements are disposed along the inner side of the tubular side wall so that while the heat emitted from the front side of the element portion radiates towards the heating space, the heat emitted from the back side of the element portion is reflected by the inner side of the tubular side wall and passed through the gaps of the heating elements to radiate towards the heating space. In this structure, the width of the gap 24 is sufficiently greater than the width of the element portion 23 of the heating element for effectively utilizing rays of the heat reflected from the inner side of the tubular side wall. Since the gaps are arranged to extend along the axial direction of the tubular side wall and the heating elements are supported at the upper end along the axial direction by holding members, the reflected heat can be utilized at optimum efficiency while the heating elements are improved in the surface density, thus minimizing the amount of the heating elements and increasing the thermal response. Also, as the inner side of the tubular side wall is arranged of a concave shape, its reflection of the heat passing through the gaps and radiating towards the heating space can be concentrated at higher effectiveness. The concave inner side may preferably have an arcuate surface.

It is understood that the present invention is not limited to the described embodiments but may be modified without departing from the scope of the present invention.

FIGS. 13 to 17 illustrate some modifications 43 to 47 of the fast cooling pipes 40, 42 acting as the extending members. The modified fast cooling pipes 43 to 47 are made of a thermally, electrically insulating material such as alumina.

Figure 13:
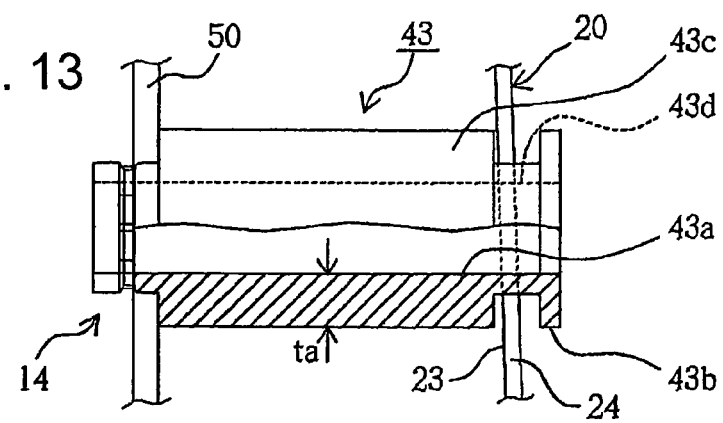
FIG. 13 is a partially broken side view of a second modification of the fast cooling pipe.

The fast cooling pipe 43 of the second modification shown in FIG. 13 has a radially enlarged portion 43c thereof provided substantially equal in the diameter to its flange portion 43b to extend to the inner shell 50 and an extending-through portion 43d thereof provide to extend through the gap 24 of the heating element 20. The thickness ta of the radially enlarged portion 43c is greater than that of the corresponding embodiment and can thus prevent the cooling gas passing through the bore 43a from being heated up by the atmosphere at the outside of the radially enlarged portion 43c. Accordingly, the cooling gas can be released from the bore 43a while its temperature remains low.

Figure 14:
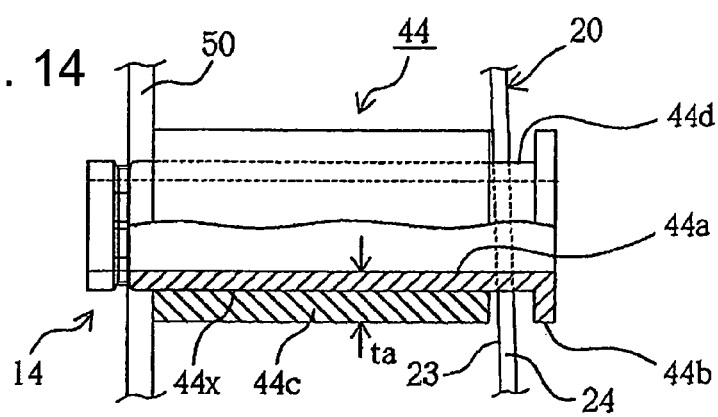
FIG. 14 is a partially broken side view of a third modification of the fast cooling pipe.

The fast cooling pipe 44 of the third modification shown in FIG. 14 has a small diameter portion 44x thereof provided equal in the diameter to its extending-through portion 44d and arranged onto which an outer pipe 44c equal in the diameter to its flange portion 44b is fitted. The total thickness ta of the small diameter portion 44x and the outer pipe 44c is greater than that of the corresponding embodiment and its advantage is identical to that of the second modification.

Figure 15A:
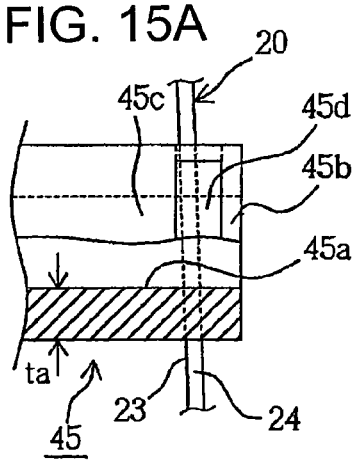
FIGS. 15A and 15B are a partially broken side view and a front view respectively of a fourth modification of the fast cooling pipe where is cut in at the flange portion.
Figure 15B:
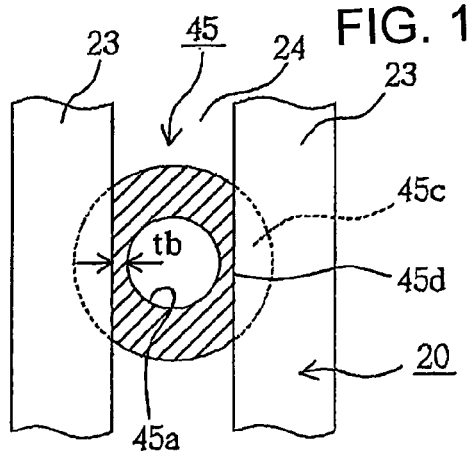

The fast cooling pipe 45 of the fourth modification shown in FIG. 15 has a flange portion 45b and a radially increased portion 45c at a thickness ta thereof provided equal in the diameter to each other while its extending-through portion 45d is shaped by cutting in from both, left and right, sides. The extending-through portion 45d is held in the gap 35 as inserted from the upper turned portions 21 side. The thinned wall tb of the extending-through portion 45d is minimized in the area thus to prevent the cooling gas from being undesirably heated up.

Figure 16A:
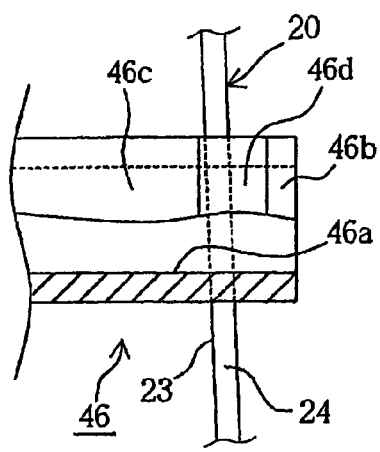
FIGS. 16A and 16B are a partially broken side view and a front view respectively of a fifth modification of the fast cooling pipe.
Figure 16B:
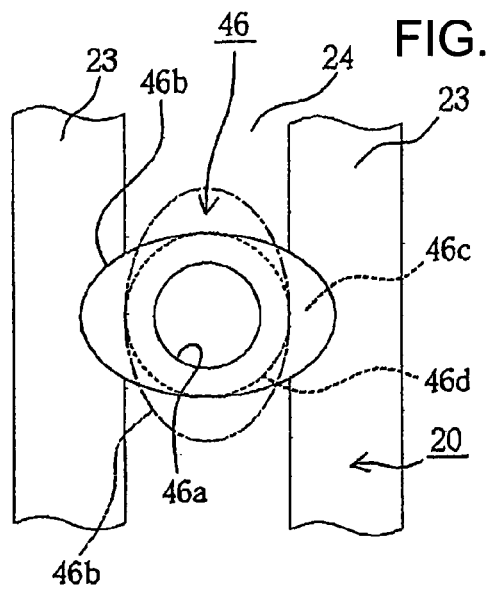

The fast cooling pipe 46 of the fifth modification shown in FIG. 16 has a flange portion 46b and a radially enlarged portion 46c thereof both arranged of an elliptical shape as identical to each other when viewed from the axial direction of its bore 46a. The minor axis of the elliptical shape is shorter than the gap 24 thus allowing the flange portion 46b to be inserted into the gap 24 with its major axis extending along the lengthwise direction of the gap 24. The diameter of the extending-through portion 46d is substantially equal to the length of the minor axis. When the major axis of the flange portion 46b has been turned about ninety degrees after the insertion, the flange portion 46b and the radially enlarged portion 46c protect the heating element 20 from being displaces in the extending direction. More particularly, the action of joining the heating elements 20 with the hanging insulators 30 and the action of joining the heating elements 20 with the fast cooling pipes 46 can be carried out separately at different steps.

Figure 17A:
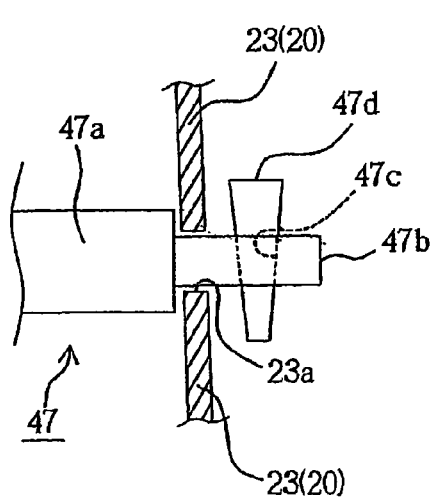
FIGS. 17A and 17B are a partially broken side view and a front view respectively of a sixth modification of the fast cooling pipe.
Figure 17B:
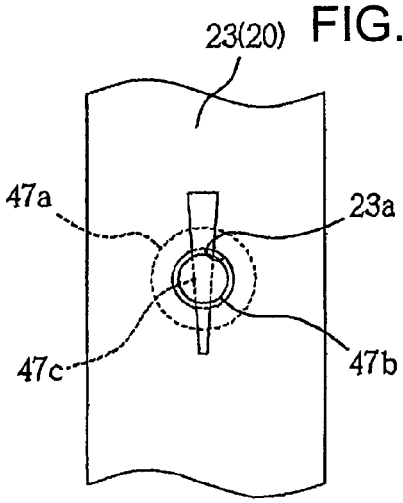

The sixth modification in the form of a support bar 47 shown in FIG. 17 has a small diameter portion 47b thereof provided to project in the extending direction from its radially enlarged portion 47a fixedly mounted to the inner shell 50 and extend through the hole 23a in the heating element 20. Then, a wedge 47d is inserted into its corresponding through hole 47c provided in the small diameter portion 47b thus to inhibit the displacement of the heating element 20.

Figure 18:
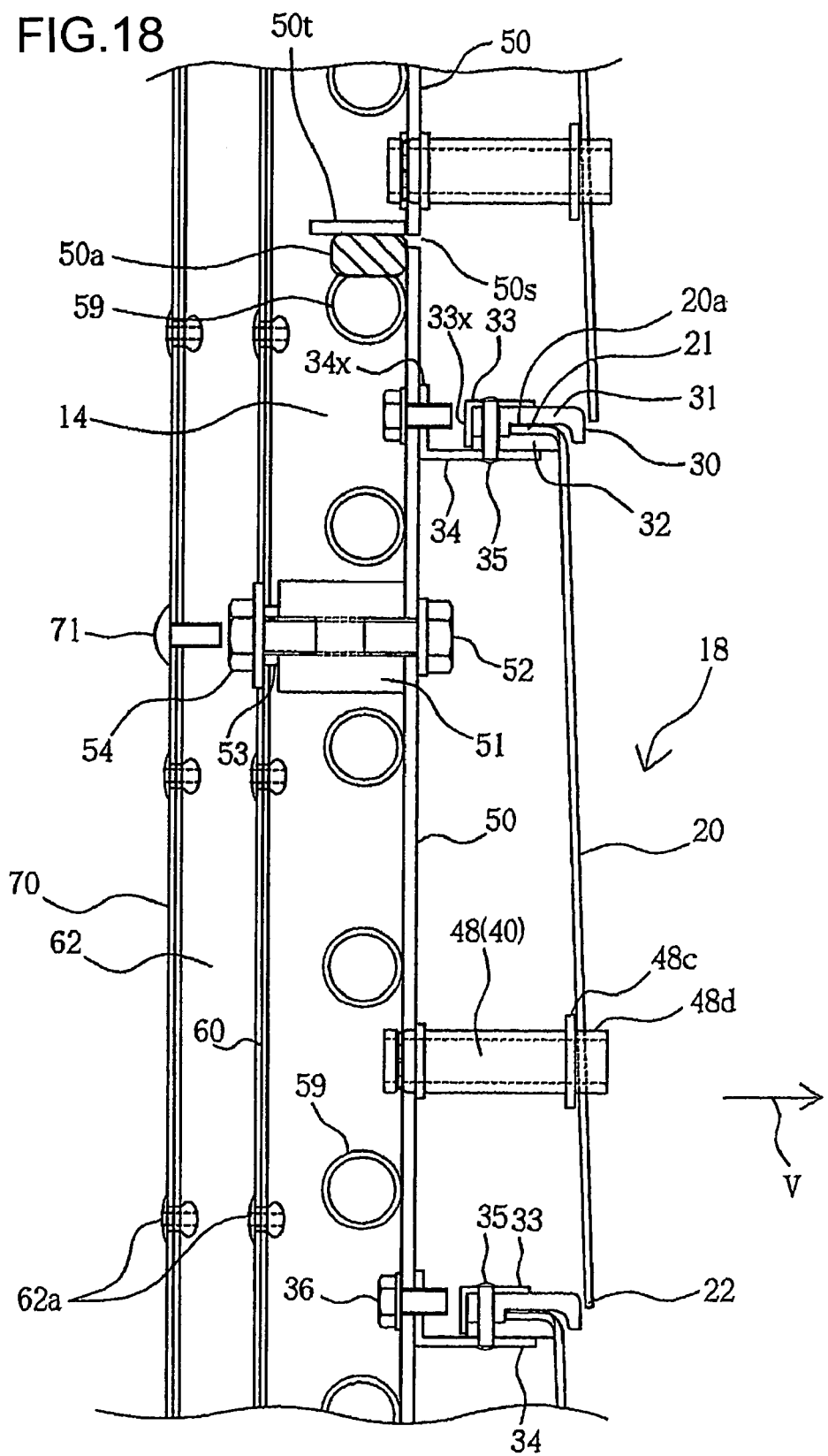
FIG. 18 is a view, similar to FIG. 4, showing a seventh modification of the fast cooling pipe.
Figure 19:
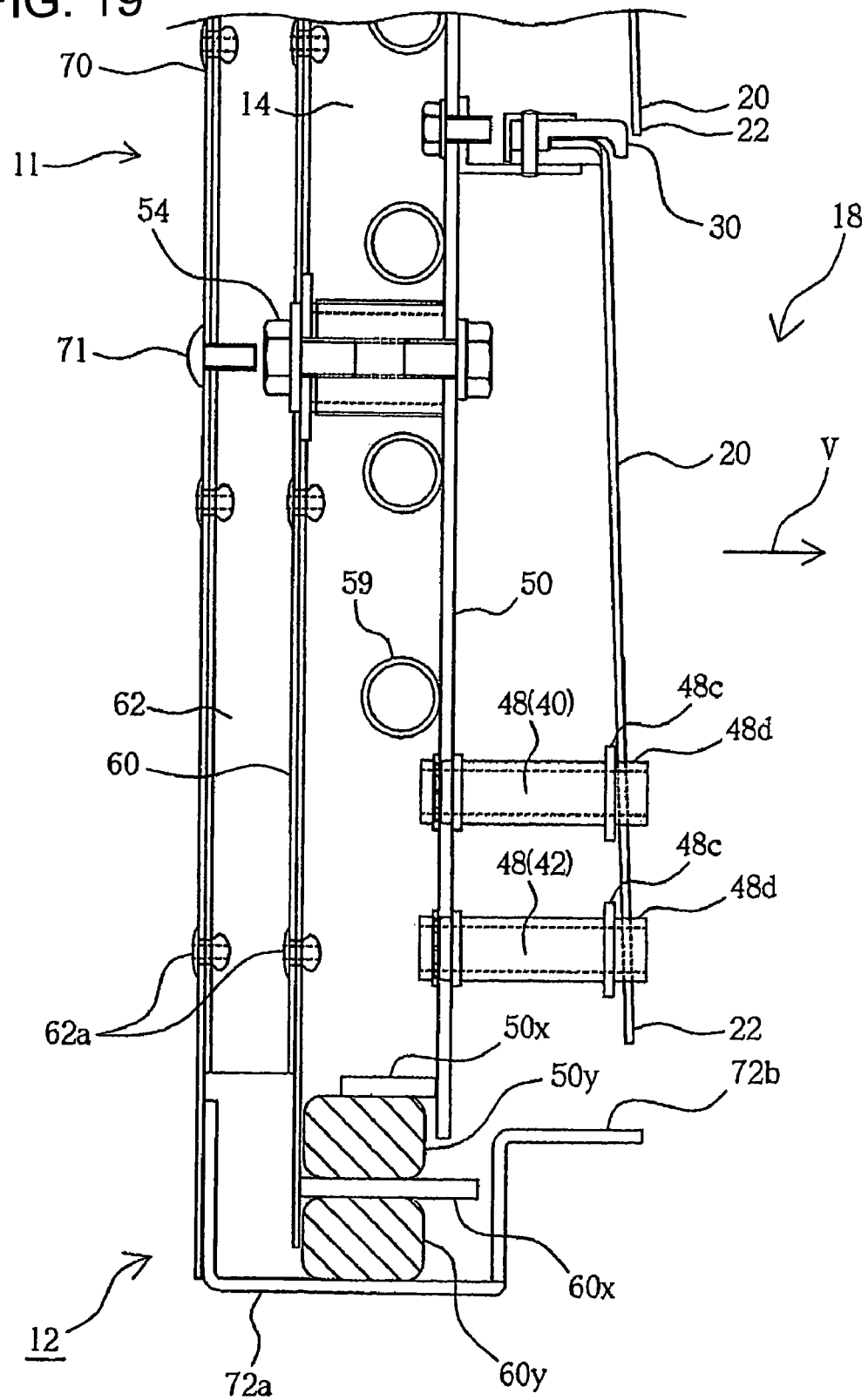
FIG. 19 is a view, similar to FIG. 7, showing the seventh modification of the fast cooling pipe.

Respectively shown in FIGS. 18 and 19 are the other fast cooling pipes 40 and 42 serving as the extending members (of the seventh modification). The fast cooling pipe 40 of the seventh embodiment has a projected portion or flange portion 48b thereof provided only at the inner shell 50 side (the back side) of the heating element 20 and arranged of substantially a circular shape to project from its extending-through portion 48d. The flange portion 48b disposed at the inner shell 50 side of the heating element 20 can inhibit the heating element 20 from being thermally deformed towards the inner shell 50, thus allowing no contact with or no short-circuit to the inner shell 50.

In the prior art, the side wall is made of an electrically insulating material or a thermally insulating material in view of the thermal deformation causing the direct contact between the heating element and the side wall. However, the side wall of those materials is increased in the heat capacity thus declining the thermal response in the heating apparatus. The projected portion of the extending member in this modification is located at the side wall side of the heating element thus to inhibit the heating element from being deflected by thermally deformation towards the sidewall. As the result, the side wall made of a metallic material is minimized in the heat capacity, hence enhancing the thermal response in the heating apparatus.

Also, since the projected or flange portion is not provided at the front side (the heating space 18 side) of the heating element 20, the action of mounting the fast cooling pipe can be conducted with much ease. Moreover, the front side of the heating element 20 remains free from the flange portion and its heating action can be increased in the efficiency. With the flange portion at one side but not at both, front and back, sides, the action of assembling the heating elements 20 can be facilitated.

The heating elements 20 are supported at the upper end by the hanging insulators 30 so that it hangs and tilts from the vertical direction towards the inner shell 50 with the lower end 22 kept further from the inner shell 50 than the upper end 21. This prevents the heating elements 20 from being biased towards the inner shell 50 by the effect of thermal deformation while hardly being deflected towards the heating space 18.

Similarly, the projected portion may be provided only at the inner shell 50 side in any of the foregoing embodiments. It may also be favorable for employing a combination of the extending member with its two projected portions provided at both, front and back, sides of the heating element and the extending member with its projected portion provided only at the side wall side.

Although the reactor container is equipped with the thermal equalizer tube and the reactor tube in the description, it may include only the reactor tube but not the thermal equalizer tube. Alternatively, the number of the tubes is not limited to two but may be one or three with equal success.

The thermal processing action may be applied to not only the oxidation or the diffusion but also the reflow action, the annealing action, or the layer forming action for planarization or activation of the carriers after the ion implantation. The substrate is not limited to a wafer but may be any other relevant planer object such as a photo mask, a printed circuit board, a liquid crystal panel, an optical disk, or a magnetic disk. The present invention is also applicable to not only a batch-type heat processing apparatus or a layer-type heat processing apparatus but also a semiconductor manufacturing system equipped with a heater unit. The inner side of the inner shell 50 or the reflecting member 91 may be mirror finished by not only stainless polishing but also plating with gold, platinum, or any other noble metal.

The present invention is described in the form of the preferred embodiments and may equally be implemented by comprehensively the following embodiments.

A first example of the heating apparatus according to the present invention is provided comprising: heating elements arranged of a sheet form and having notches or through holes provided therein; a side wall member made of an electrically conductive material and arranged to surround and define the heating space; holding members disposed at the heating space side of the side wall member for holding at one end the heating elements; and extending members, each member comprising an extending-through portion arranged to project from the heating space side of the side wall member and extend through the notch or through hole between both ends in the heating element and projected portions arranged to project at both, front and back, sides of the heating element from the extending-through portion in a direction, which is orthogonal to the extending direction of the extending-through portion, thus to inhibit the displacement of the heating elements along the extending direction.

A second example of the heating apparatus according to the present invention is provided comprising: heating elements arranged of a sheet form and having notches or through holes provided therein; a side wall member made of an electrically conductive material and arranged to surround and define the heating space; holding members disposed at the heating space side of the side wall member for holding at one end the heating elements; and extending members, each member comprising an extending-through portion arranged to project from the heating space side of the side wall member and extend through the notch or through hole between both ends in the heating element and a projected portion arranged to project at the side wall member side of the heating element from the extending-through portion in a direction, which is orthogonal to the extending direction of the extending-through portion, thus to inhibit the displacement of the heating elements towards the side wall member.

The first or second example may be modified in which the projected portion is arranged of a flange form. Alternatively, it may be modified in which two or more of the extending members are provided to extend through at least one of the notches or through holes provided in each heating element, at least one of the extending members located to extend through the notch or through hole provided at the lower end of the heating element.

The first example may be modified in which the projected portion is arranged to span from the back side of the heating element to the side wall member. The second example may be modified in which the projected portion is arranged to span from the side wall member side of the heating element to the side wall member. Alternatively, the projected portion may be provided separately of the extending-through portion. The projected portion may be provided separately of the extending-through portion. The extending-through portion may have a recess provided therein where the projected portion is located. The projected portion may be arranged of an elliptical shape where the minor axis is shorter than the width of the notch or through hole in the heating element while the major axis is longer than the width of the notch or through hole in the heating element. The extending-through portion may have a through hole provided therein into which the projected portion arranged of a wedge form is inserted. The second example may be modified in which the heating elements are held to tilt from the vertical direction so that one end thereof comes closer to the heating space than the other end. This allows the heating elements to stay biased towards the projected portion by gravitation when they suffer from the thermal deformation and can be inhibited from being displaced towards the heating space.

A third example of the heating apparatus according to the present invention is provided comprising: heating elements arranged of a zigzag form where the upper turned portions are squared and the lower turned portions are arched; and insulators for holding the upper portions of the heating element, wherein the insulator is arranged to have projections thereof formed to come into direct contact with both ends of two adjacent upper turned portions of the heating element.

A fourth example of the heating apparatus according to the present invention is provided comprising: heating elements; a first inner shell of a tubular shape disposed at the outside of the heating elements and having a first flange provided at the lower end thereof; a second inner shell of a tubular shape disposed at the outside of the heating elements and having a second flange provided at the upper end thereof; and elastic members disposed between the first flange and the second flange.

A substrate processing apparatus according to the present invention is provided in which a reactor container is disposed in the heating space in the heating apparatus of any of the examples 1 to 4 for processing a substrate.

A first example of the method of manufacturing semiconductor devices according to the present invention is provided comprising: loading a substrate into a reactor container; and heating up the reactor container installed in a heating apparatus which comprises heating elements arranged of a sheet form and having notches or through holes provided therein; a side wall member made of an electrically conductive material and arranged to surround and define the heating space; holding members disposed at the heating space side of the side wall member for holding at one end the heating elements; and extending-though members, each member comprising an extending-through portion arranged to project from the heating space side of the side wall member and extend through the notch or through hole between both ends in the heating element and projected portions arranged to project at both, front and back, sides of the heating element from the extending-through portion in a direction, which is orthogonal to the extending direction of the extending-through portion, thus to inhibit the displacement of the heating elements along the extending direction; and processing a substrate.

A second example of the method of manufacturing semiconductor devices according to the present invention is provided comprising: loading a substrate into a reactor container; and heating up the reactor container installed in a heating apparatus which comprises heating elements arranged of a sheet form and having notches or through holes provided therein; a side wall member made of an electrically conductive material and arranged to surround and define the heating space; holding members disposed at the heating space side of the side wall member for holding at one end the heating elements; and extending members, each member comprising an extending-through portion arranged to project from the heating space side of the side wall member and extend through the notch or through hole between both ends in the heating element and a projected portion arranged to project at the side wall member side of the heating element from the extending-through portion in a direction, which is orthogonal to the extending direction of the extending-through portion, thus to inhibit the displacement of the heating elements towards the side wall member; and processing a substrate.

A first example of the extending member for use in a heating apparatus which at least includes heating elements arranged of a sheet form and having notches or through holes provided therein, a side wall member made of an electrically conductive material and arranged to surround and define the heating space, and holding members disposed at the heating space side of the side wall member for holding at one end the heating elements, is provided comprising: an extending-through portion arranged to project from the heating space side of the side wall member and extend through the notch or through hole between both ends in the heating element; and projected portions arranged to project at both, front and back, sides of the heating element from the extending-through portion in a direction, which is orthogonal to the extending direction of the extending-through portion, thus to inhibit the displacement of the heating elements along the extending direction.

A second example of the extending member for use in a heating apparatus which at least includes heating elements arranged of a sheet form and having notches or through holes provided therein, a side wall member made of an electrically conductive material and arranged to surround and define the heating space, and holding members disposed at the heating space side of the side wall member for holding at one end the heating elements, is provided comprising: an extending-through portion arranged to project from the heating space side of the side wall member and extend through the notch or through hole between both ends in the heating element; and a projected portion arranged to project at the side wall member side of the heating element from the extending-through portion in a direction, which is orthogonal to the extending direction of the extending-through portion, thus to inhibit the displacement of the heating elements towards the side wall member.

The present invention is favorably applicable to a substrate processing apparatus for use in, for example, the oxidation or the diffusion, the reflow action, the annealing action, and the layer forming action by thermal CVD technique for planarization or activation of the carriers after the ion implantation over a semiconductor wafer on which semiconductor integrated circuit assemblies (semiconductor devices) are developed. The present invention is particularly advantageous in the processing action at lower temperatures of the substrate processing apparatus.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

The disclosure of Japanese Patent Application Nos. 2007-167003 and 2008-154377 filed on Jun. 25, 2007 and Jun. 12, 2008 respectively, including specification, drawings and claims is incorporated herein by reference in its entirety.

What is claimed is:
1. A heating apparatus comprising:
heating elements arranged of a sheet form and having notches or through holes provided therein;
a side wall member made of an electrically conductive material and arranged to surround and define the heating space;

holding members disposed at the heating space side of the side wall member for holding at one end the heating elements; and extending members, each member comprising an extending-through portion arranged to project from the heating space side of the side wall member and extend through the notch or through hole between both ends in the heating element and projected portions arranged to project at both, front and back, sides of the heating element from the extending-through portion in a direction, which is orthogonal to the extending direction of the extending-through portion, thus to inhibit the displacement of the heating elements along the extending direction.

2. A heating apparatus comprising:

heating elements arranged of a sheet form and having notches or through holes provided therein;

a side wall member made of an electrically conductive material and arranged to surround and define the heating space;

holding members disposed at the heating space side of the side wall member for holding at one end the heating elements; and extending members, each member comprising an extending-through portion arranged to project from the heating space side of the side wall member and extend through the notch or through hole between both ends in the heating element and a projected portion arranged to project at the side wall member side of the heating element from the extending-through portion in a direction, which is orthogonal to the extending direction of the extending-through portion, thus to inhibit the displacement of the heating elements towards the side wall member.

3. A heating apparatus according to claim 1 or 2, wherein the projected portion is arranged of a flange form.

4. A heating apparatus according to claim 1 or 2, wherein two or more of the extending members are provided to extend through at least one of the notches or through holes provided in each heating element, at least one of the extending members located to extend through the notch or through hole provided at the lower end of the heating element.

5. A heating apparatus according to claim 1, wherein the projected portion is arranged to span from the back side of the heating element to the side wall member.

6. A heating apparatus according to claim 2, wherein the projected portion is arranged to span from the side wall member side of the heating element to the side wall member.

7. A heating apparatus according to claim 5, wherein the projected portion is provided separately of the extending-through portion.

8. A heating apparatus according to claim 6, wherein the projected portion is provided separately of the extending-through portion.

9. A heating apparatus according to claim 5 or 6, wherein the extending-through portion has a recess provided therein where the projected portion is located.

10. A heating apparatus according to claim 5 or 6, wherein the projected portion is arranged of an elliptical shape where the minor axis is shorter than the width of the notch or through hole in the heating element while the major axis is longer than the width of the notch or through hole in the heating element.

11. A heating apparatus according to claim 1 or 2, wherein the extending-through portion has a through hole provided therein into which the projected portion arranged of a wedge form is inserted.

12. A heating apparatus according to claim 2, wherein the heating elements are held to tilt from the vertical direction so that one end thereof comes closer to the heating space than the other end.

13. A heating apparatus comprising:

heating elements arranged of a zigzag form where the upper turned portions are squared and the lower turned portions are arched; and insulators for holding the upper portions of the heating element, wherein the insulator is arranged to have projections thereof formed to come into direct contact with both ends of two adjacent upper turned portions of the heating element.

14. A substrate processing apparatus comprising:

a reactor container disposed in the heating space in the heating apparatus defined in claim 1 or 2 for processing a substrate.

15. A substrate processing apparatus according to claim 13, further comprising:

a reactor container disposed in the heating space in the heating apparatus for processing a substrate.

16. A method of manufacturing semiconductor devices comprising:

loading a substrate into a reactor container; and heating up the reactor container installed in a heating apparatus which comprises heating elements arranged of a sheet form and having notches or through holes provided therein; a side wall member made of an electrically conductive material and arranged to surround and define the heating space; holding members disposed at the heating space side of the side wall member for holding at one end the heating elements; and extending-though members, each member comprising an extending-through portion arranged to project from the heating space side of the side wall member and extend through the notch or through hole between both ends in the heating element and projected portions arranged to project at both, front and back, sides of the heating element from the extending-through portion in a direction, which is orthogonal to the extending direction of the extending-through portion, thus to inhibit the displacement of the heating elements along the extending direction; and processing a substrate.

17. A method of manufacturing semiconductor devices comprising:

loading a substrate into a reactor container; and heating up the reactor container installed in a heating apparatus which comprises heating elements arranged of a sheet form and having notches or through holes provided therein; a side wall member made of an electrically conductive material and arranged to surround and define the heating space; holding members disposed at the heating space side of the side wall member for holding at one end the heating elements; and extending members, each member comprising an extending-through portion arranged to project from the heating space side of the side wall member and extend through the notch or through hole between both ends in the heating element and a projected portion arranged to project at the side wall member side of the heating element from the extending-through portion in a direction, which is orthogonal to the extending direction of the extending-through portion, thus to inhibit the displacement of the heating elements towards the side wall member; and processing a substrate.

18. An extending member for use in a heating apparatus which at least includes heating elements arranged of a sheet form and having notches or through holes provided therein, a side wall member made of an electrically conductive material and arranged to surround and define the heating space, and holding members disposed at the heating space side of the side wall member for holding at one end the heating elements, comprising:
- an extending-through portion arranged to project from the heating space side of the side wall member and extend through the notch or through hole between both ends in the heating element; and
- projected portions arranged to project at both, front and back, sides of the heating element from the extending-through portion in a direction, which is orthogonal to the extending direction of the extending-through portion, thus to inhibit the displacement of the heating elements along the extending direction.

19. An extending member for use in a heating apparatus which at least includes heating elements arranged of a sheet form and having notches or through holes provided therein, a side wall member made of an electrically conductive material and arranged to surround and define the heating space, and holding members disposed at the heating space side of the side wall member for holding at one end the heating elements, comprising:
- an extending-through portion arranged to project from the heating space side of the side wall member and extend through the notch or through hole between both ends in the heating element; and
- a projected portion arranged to project at the side wall member side of the heating element from the extending-through portion in a direction, which is orthogonal to the extending direction of the extending-through portion, thus to inhibit the displacement of the heating elements towards the side wall member.

* * * * *